(12) United States Patent
Cho et al.

(10) Patent No.: US 8,164,107 B2
(45) Date of Patent: Apr. 24, 2012

(54) LIGHT EMITTING DEVICE AND METHOD OF MANUFACTURING THE SAME

(75) Inventors: Hyun Kyong Cho, Seoul (KR); Sun Kyung Kim, Youngin-si (KR); Gyeong Geun Park, Gwacheon-si (KR)

(73) Assignee: LG Innotek Co., Ltd., Seoul (KR)

( * ) Notice: Subject to any disclaimer, the term of this patent is extended or adjusted under 35 U.S.C. 154(b) by 78 days.

(21) Appl. No.: 12/628,950

(22) Filed: Dec. 1, 2009

(65) Prior Publication Data

US 2010/0140643 A1 Jun. 10, 2010

(30) Foreign Application Priority Data

Dec. 4, 2008 (KR) .................. 10-2008-0122308

(51) Int. Cl.
*H01L 33/00* (2010.01)
(52) U.S. Cl. ............ 257/98; 257/E33.006; 257/E33.065
(58) Field of Classification Search ........... 257/E33.006, 257/E33.065
See application file for complete search history.

(56) References Cited

U.S. PATENT DOCUMENTS

| | | |
|---|---|---|
| 2005/0156175 A1 | 7/2005 | Kim |
| 2006/0234408 A1* | 10/2006 | Lee et al. .................. 438/22 |
| 2007/0125995 A1 | 6/2007 | Weisbuch et al. |
| 2007/0163490 A1 | 7/2007 | Habel et al. |
| 2007/0257269 A1* | 11/2007 | Cho et al. .................. 257/95 |
| 2008/0279242 A1 | 11/2008 | Bour |

FOREIGN PATENT DOCUMENTS

| | | |
|---|---|---|
| JP | 2005-203792 A | 7/2005 |
| JP | 2007-243152 A | 9/2007 |
| KR | 10-2005-0075054 A | 7/2005 |

OTHER PUBLICATIONS

David et al., "GaN/InGaN light emitting diodes with embedded photonic crystal obtained by lateral epitaxial overgrowth", Applied Physics Letters, vol. 92, No. 11, pp. 113514-1 to 113514-3, Mar. 20, 2008, XP012106087.
Abare et al., "Electrically pumped distributed feedback nitride lasers employing embedded dielectric gratings", Electronics Letters, Sep. 2, 1999, vol. 35, No. 18, XP06012634, pp. 1559-1560.
Zang et al., "Nanoepitaxy to improve the efficiency of InGaN light-emitting diodes", Applied Physics Letters, vol. 92, No. 24, Jun. 20, 2008, XP012107617, p. 243126.

* cited by examiner

*Primary Examiner* — Michael Lebentritt
*Assistant Examiner* — Daniel Whalen
(74) *Attorney, Agent, or Firm* — Birch, Stewart, Kolasch & Birch, LLP

(57) ABSTRACT

The light emitting device, and corresponding method of manufacture, the light emitting device including a second electrode layer; a second conductive type semiconductor layer formed on the second electrode layer; an active layer formed on the second conductive type semiconductor layer; a first conductive type semiconductor layer formed with a first photonic crystal that includes a mask layer and an air gap formed on the active layer; and a first electrode layer formed on the first conductive type semiconductor layer.

20 Claims, 5 Drawing Sheets

LIGHT EMITTING DEVICE AND METHOD OF MANUFACTURING THE SAME

CROSS-REFERENCE TO RELATED APPLICATIONS

The present application claims priority under 35 U.S.C. 119 and 35 U.S.C. 365 to Korean Patent Application No. 10-2008-0122308 (filed on Dec. 4, 2008), which is hereby incorporated by reference in its entirety.

BACKGROUND OF THE INVENTION

1. Field of the Invention

The present invention relates to a light emitting device and a method for manufacturing the same.

2. Discussion of the Related Art

A light emitting diode (LED) is a semiconductor light emitting diode that converts current to light.

The wavelength of light emitted by such a LED depends on semiconductor material used in manufacturing a LED. This is the reason that the wavelength of the emitted light depends on a band-gap of the semiconductor material that represents energy difference between valence band electrons and conduction band electrons.

Recently, the conventional light emitting diode (LED) have gradually increased brightness has been used as a light source for a display, a light source for an automobile, and a light source for lighting. In addition, the conventional LED can represent a white color having superior light efficiency by employing phosphors or combining LEDs having various colors.

Meanwhile, the brightness of the conventional light emitting diode depends on various conditions such as the structure of an active layer, a light extraction structure that can efficiently extract light to the external, chip size, sorts of molding member that surrounds the light emitting diode, etc.

SUMMARY OF THE INVENTION

Embodiments of the invention provide a light emitting device having a new and improved structure and a method for manufacturing the same.

Embodiments of the invention provide a light emitting device with improved light extraction efficiency and a method for manufacturing the same.

Embodiments of the invention provide a light emitting device with improved light emitting efficiency and a method for manufacturing the same.

In an embodiment, there is a light emitting device that includes: a second electrode layer; a second conductive type semiconductor layer on the second electrode layer; an active layer on the second conductive type semiconductor layer; a first conductive type semiconductor layer comprising a first photonic crystal comprising a mask layer and an air gap on the active layer; and a first electrode layer on the first conductive type semiconductor layer.

In another embodiment, there is a light emitting device that includes: a second electrode layer; a second conductive type semiconductor layer on the second electrode layer; an active layer on the second conductive type semiconductor layer; a first conductive type semiconductor layer comprising a first photonic crystal on the active layer; a non-conductive semiconductor layer comprising a second photonic crystal on the first conductive type semiconductor layer; and a first electrode layer on the first conductive type semiconductor layer.

DETAILED DESCRIPTION OF THE EMBODIMENTS

Figure 1:
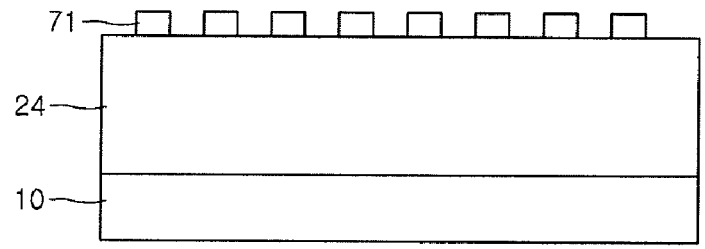
FIGS. 1 to 5 are views explaining a light emitting device according to a first embodiment and a method for manufacturing the same.

In the description of embodiments, when each layer (film), an area, a pattern or structures are described to be formed "on" or "under" each layer (film), the area, the pattern or the structures, it can be understood as the case that each layer (film), an area, a pattern or structures are formed by being directly contacted to each layer (film), the area, the pattern or the structures and it can further be understood as the case that other layer (film), other area, other pattern or other structures are additionally formed therebetween. Also, being "on" or "under" each layer will be described based on the drawings.

In the drawings, the thickness or size of each layer is exaggerated, omitted or schematically illustrated for the convenience and clarity of explanation. Also, the size of each constituent does not completely reflect its actual size.

Figure 11:
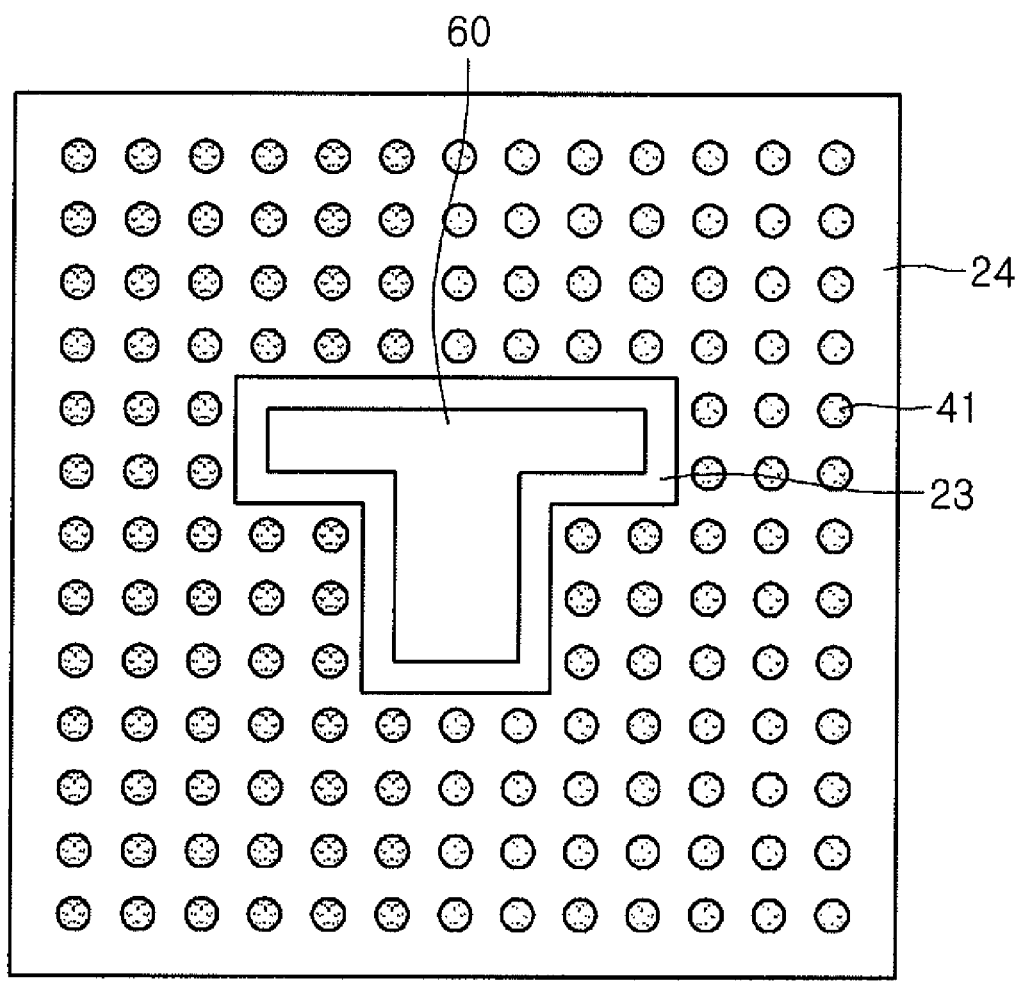
FIG. 11 is a view of the light emitting device of the first embodiment seen from the upper direction.

FIGS. 1 to 5 are views explaining a light emitting device according to a first embodiment and a method for manufacturing the same, and FIG. 11 is a view of the light emitting device of the first embodiment seen from the upper direction.

Figure 5:
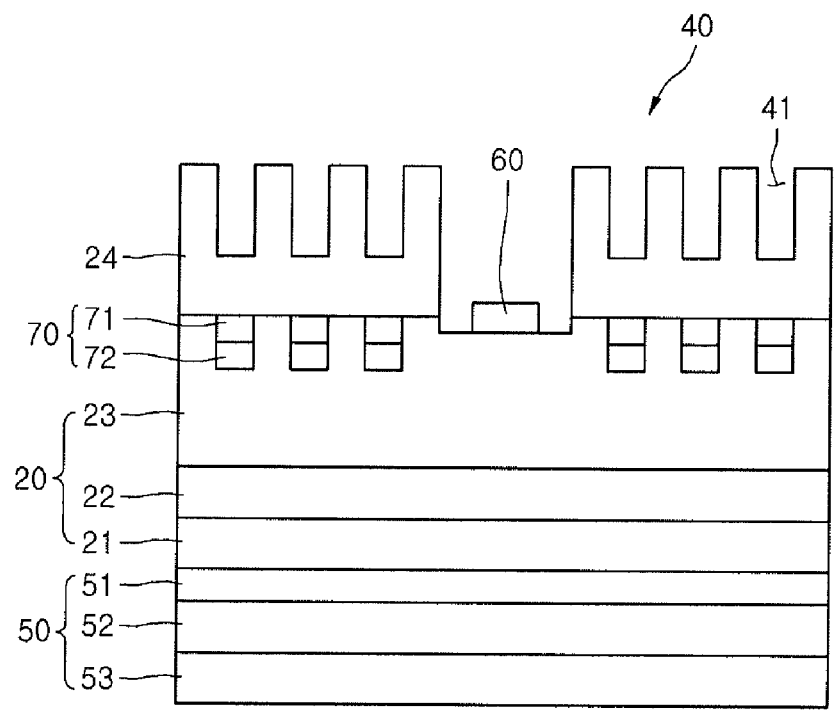

First, referring to FIG. 5, the light emitting device according to the first embodiment includes a second electrode layer 50, a light emitting semiconductor layer 20 formed on the second electrode layer 50, a first electrode layer 60 formed on the light emitting semiconductor layer 20, and a non-conductive semiconductor layer 24 formed on the light emitting semiconductor layer 20.

The second electrode layer 50 may include an ohmic contact layer 51, a reflective layer 52, and a conductive substrate 53. For example, the conductive substrate 53 may be formed of at least one of copper (Cu), titanium (Ti), chrome (Cr), aluminum (Al), platinum (Pt), gold (Au), tungsten (W) or a semiconductor layer implanted with impurity, the reflective layer 52 may be formed of metal including at least one of silver (Ag), aluminum (Al), copper (Cu) and nickel (Ni) that have a high reflectance, and the ohmic contact layer 51 may be formed of a transpired electrode layer, for example, at least one of ITO, ZnO, $RuO_x$, $TiO_x$ or $IrO_x$.

The light emitting semiconductor layer 20 includes a first conductive type semiconductor layer 23, an active layer 22, and a second conductive type semiconductor layer 21. The light emitting semiconductor layer 23 may be formed of GaN based material. Herein, if the first conductive type semiconductor layer 23 is a n-type semiconductor layer, the second conductive type semiconductor layer 21 may be a p-type semiconductor layer, and if the first conductive type semiconductor layer 23 is a p-type semiconductor layer, the second conductive type semiconductor layer 21 may be a n-type semiconductor layer.

A first electrode layer 60 is formed on the first conductive type semiconductor layer 23. The first electrode layer 60 supplies power to the active layer 22, together with the second electrode layer 50.

The non-conductive semiconductor layer 24 is a semiconductor layer that is formed of material having electrical conductivity remarkably lower rather than that of the first conductive type semiconductor layer 23 and the second conductive type semiconductor layer 21. For example, the non-conductive semiconductor layer 24 may be an un-doped GaN layer.

Meanwhile, a first photonic crystal 70 that includes mask layers 71 and air gaps 72 is formed in the first conductive type semiconductor layer 23. The air gap 72 is disposed under the mask layer 71 and is surrounded by the mask layer 71 and the first conductive type semiconductor layer 23.

The upper surface of the mask layer 71 is disposed on the same horizontal plane with the upper surface of the first conductive type semiconductor layer 23.

The mask layers 71 and the air gaps 72 may be disposed in the first conductive type semiconductor layer 23 according to a first period. Herein, the first period are values obtained by averaging the distance from the center of the mask layer 71 to the center of an adjacent mask layer 71. The air gap 72 is formed corresponding to the mask layer 71 so that the air gap 72 is also disposed having a first period in the same manner as the mask layer 71.

In the embodiment, the first period is designed to be $\lambda/n$ to $10\lambda/n$. Herein, n is the refractive index of the first conductive type semiconductor layer 23, and $\lambda$ is the wavelength of light emitted from the active layer 22. In order for the first photonic crystal 70 to increase the light extraction efficiency, the first period is designed to be $\lambda/n$ to $10\lambda/n$.

The mask layer 71 and the air gap 72 that form the first photonic crystal 70 have a refractive index smaller than that of material that forms the light emitting semiconductor layer 20, for example, a GaN substrate semiconductor layer, and the first photonic crystal 70 may allow the light emitted from the active layer 22 to be efficiently transmitted to the upper side of the first conductive type semiconductor layer 23 by a diffraction effect.

Also, in order to improve the light extraction effect, a second photonic crystal 40 may also be formed on or in the non-conductive semiconductor layer 24.

The second photonic crystal 40 includes a plurality of holes 41 in the non-conductive semiconductor layer 24. In FIGS. 5 and 11, the second photonic crystal 40 is shown to include the periodic holes 41 that are formed by etching the non-conductive semiconductor layer 24, however, the second photonic crystal 40 may also include a plurality of pillars (not shown) instead of the plurality of holes 41.

In the embodiment, the plurality of holes 41 may be disposed in accordance with a second period. For example, the second period may be $\lambda/n$ to $10\lambda/n$. Herein, n is the refractive index of the non-conductive type semiconductor layer 24, and $\lambda$ is the wavelength of light emitted from the active layer 22.

The second photonic crystal 40 may allow the light emitted from the active layer 22 to be efficiently transmitted to the upper side of the non-conductive type semiconductor layer 24 by a diffraction effect.

Hereinafter, a method for manufacturing the light emitting device according to the first embodiment will be described with reference to FIGS. 1 to 5.

Referring to FIG. 1, a non-conductive semiconductor layer 24 is formed on a substrate 10, and mask layers 71 are formed on the non-conductive semiconductor layer 24. The mask layers 71 are selectively formed on the non-conductive semiconductor layer 24 and are disposed to have a first period.

For example, the mask layer 71 may be formed by depositing $SiO_2$ through a plasma-enhanced chemical vapor deposition (PEDVD) and then patterning it, wherein the first period is designed to be $\lambda/n$ to $10\lambda/n$. Herein, n is the refractive index of the first conductive type semiconductor layer 23, and $\lambda$ is the wavelength of light emitted from the active layer 22.

Figure 2:
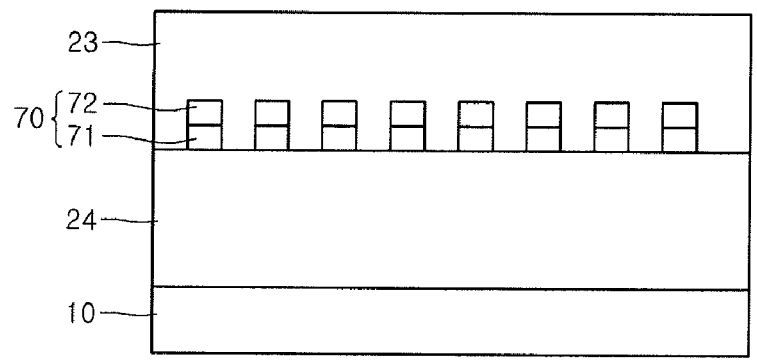

Referring to FIG. 2, the first conductive type semiconductor layer 23 is grown on the non-conductive semiconductor layer 24 on which the mask layers 71 are formed. The first conductive type semiconductor layer 23 does not grow on the mask layers 71 but grows on the non-conductive semiconductor layer 24 on which the mask layers 71 are not formed.

Although the first conductive type semiconductor layer grows vertically and horizontally, the growth rate in the horizontal direction is smaller than the growth rate in the vertical direction so that the first conductive type semiconductor layer 23 is not formed at positions where the mask layers 71 are positioned and right on the mask layers 71.

Therefore, as shown in FIG. 2, air gaps 72 are formed on the mask layers 71, having the first period, and a first photonic crystal 70 is formed in the first conductive type semiconductor layer 23.

At this time, the first conductive type semiconductor layer 23 on the air gaps 72 has high-quality crystallinity that hardly and includes dislocations. Thus, the internal quantum efficiency of the light emitting device is increased, making it possible to manufacture high efficiency light emitting device.

Figure 3:
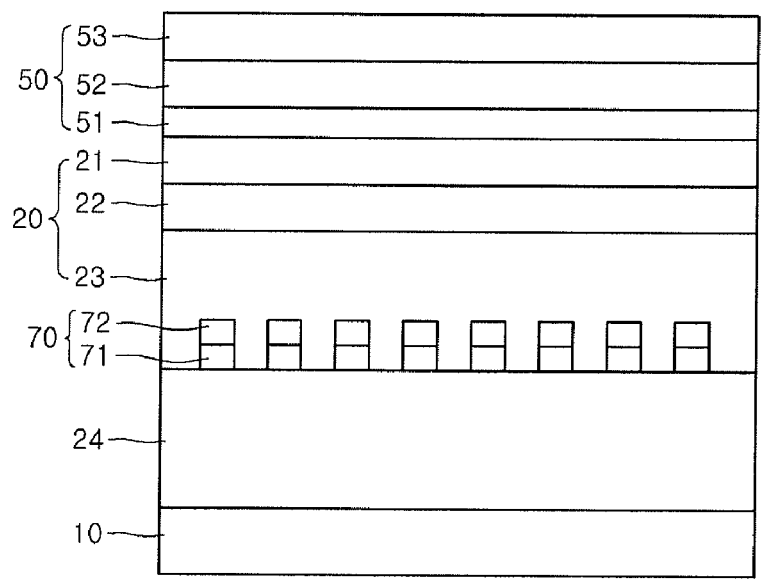

Referring to FIG. 3, a light emitting semiconductor layer 20 is formed by allowing an active layer 22 and a second conductive type layer 21 to grow on the first conductive type semiconductor layer 23.

And, a second electrode layer 50 that includes an ohmic contact layer 51, a reflective layer 52, and a conductive substrate 53 is formed on the light emitting semiconductor layer 20.

Figure 4:
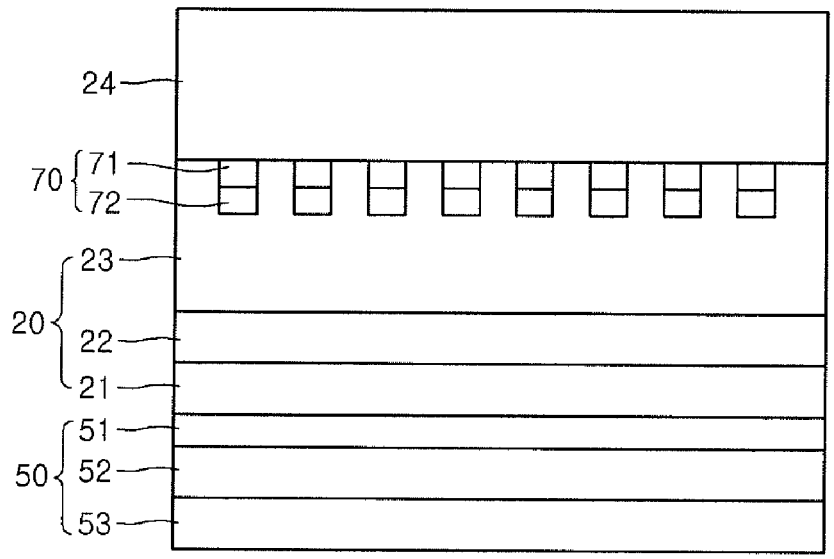

Referring to FIG. 4, the non-conductive semiconductor layer 24 is exposed by removing the substrate 10.

Referring to FIG. 5, the first conductive type semiconductor layer 23 is exposed by selectively removing the non-conductive semiconductor layer 24, and a first electrode layer 60 is formed on the first conductive type semiconductor layer 23.

Also, a second photonic crystal 40 that includes a plurality of holes 41 is formed on the upper surface of the non-conductive semiconductor layer 24. The second photonic crystal that includes the plurality of holes 41 is formed by selectively removing the non-conductive semiconductor layer 24.

Therefore, the light emitting device according to the first embodiment can be manufactured.

FIGS. 6 to 10 are views explaining a light emitting device according to a second embodiment and a method for manufacturing the same. When explaining the light emitting device according to the second embodiment and the method for manufacturing the same, the description overlapped with the aforementioned first embodiment will be omitted.

Figure 10:
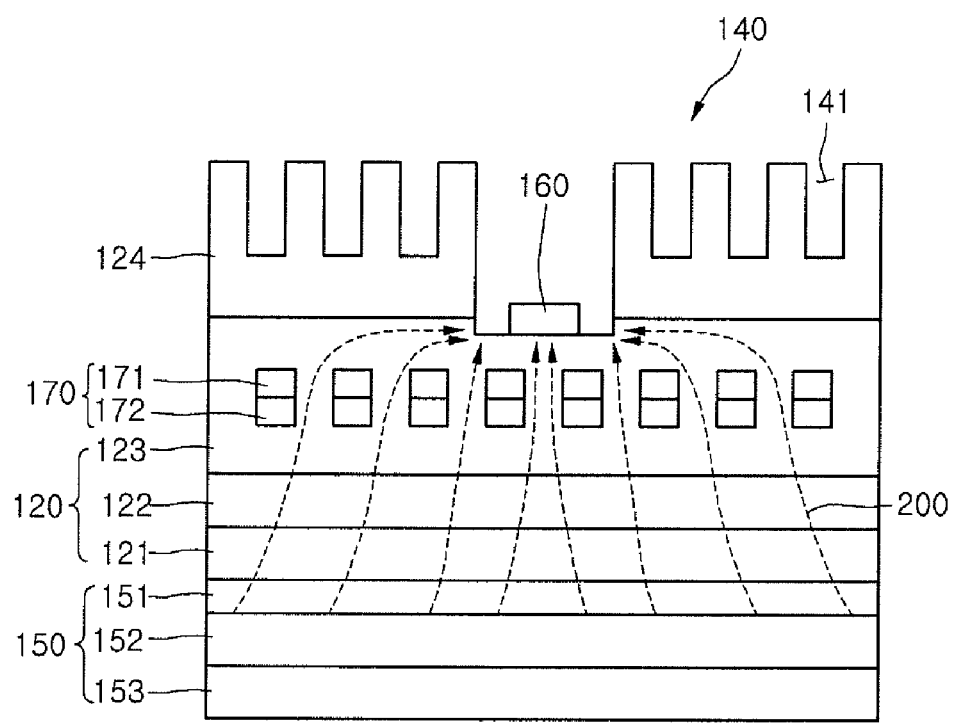

Referring to FIG. 10, the light emitting device according to the second embodiment includes a second electrode layer 150, a light emitting semiconductor layer 120 formed on the second electrode layer 150, a first electrode layer 160 formed on the light emitting semiconductor layer 120, and a non-conductive semiconductor layer 124 formed on the light emitting semiconductor layer 120.

The second electrode layer 150 may include an ohmic contact layer 151, a reflective layer 152, and a conductive substrate 153.

The light emitting semiconductor layer 120 may include a first conductive type semiconductor layer 123, an active layer 122, and a second conductive type semiconductor layer 121, and the light emitting semiconductor layer 120 may be formed of GaN based material.

A first electrode layer 160 is formed on the first conductive type semiconductor layer 123. The first electrode layer 160 supplies power to the active layer 122, together with the second electrode layer 150.

The non-conductive semiconductor layer 124 is a semiconductor layer that is formed of material having electrical conductivity remarkably lower rather than that of the first conductive type semiconductor layer 123 and the second conductive type semiconductor layer 121, wherein the non-conductive semiconductor layer 124 may be, for example, an un-doped GaN layer.

Meanwhile, a first photonic crystal 170 that includes mask layers 171 and air gaps 172 is formed in the first conductive type semiconductor layer 123. The air gap 172 is surrounded by the mask layer 171 and the first conductive type semiconductor layer 123. The upper surface and the side surface of the mask layer 171 contact the first conductive type semiconductor layer 123, and the air gap 172 is disposed under the mask layer 171.

The mask layers 171 and the air gaps 172 are disposed in accordance with a first period. Herein, the first period are values obtained by averaging the distance from the center of the mask layer 171 to the center of an adjacent mask layer 171. The air gap 172 is formed corresponding to the mask layer 171 so that the air gap 172 is also disposed having a first period in the same manner as the mask layer 171.

In the embodiment, the first period is designed to be $\lambda/n$ to $10\lambda/n$. Herein, n is the refractive index of the first conductive type semiconductor layer 123, and $\lambda$ is the wavelength of light emitted from the active layer 122.

The first photonic crystal 170 may allow the light emitted from the active layer 122 to be efficiently directed to the upper side of the first conductive type semiconductor layer 123 by a diffraction effect.

Also, the first photonic crystal 170 is disposed between the first electrode layer 160 and the second electrode layer 150 to change the direction of current 200 flowing from the second electrode layer 150 to the first electrode layer 160. In other words, the first photonic crystal 170 allows current 200 not to be flowed only in the vertical direction (i.e., from the lower side of the first electrode layer 160) but to be widely flowed in the vertical direction and in the horizontal direction, thereby allowing light to be generated from a wide area of the active layer 122. Therefore, the light emitting efficiency of the light emitting device can be improved.

At this time, the first photonic crystal 170 is disposed in a position adjacent to the second electrode layer 150 compared to the first electrode layer 160.

Also, in order to improve the light extraction effect, a second photonic crystal 140 may also be formed on or in the non-conductive semiconductor layer 124.

The second photonic crystal 140 includes a plurality of holes 141 in the non-conductive semiconductor layer 124. In the embodiment, the plurality of holes 141 may be disposed having a second period. For example, the second period may be designed to be $\lambda/n$ to $10\lambda/n$. Herein, n is the refractive index of the non-conductive type semiconductor layer 123, and $\lambda$ is the wavelength of light emitted from the active layer 122.

The second photonic crystal 140 may allow the light emitted from the active layer 122 to be efficiently transmitted to the upper side of the non-conductive type semiconductor layer 124 by a diffraction effect.

Hereinafter, a method for manufacturing the light emitting device according to the second embodiment will be described with reference to FIGS. 6 to 10.

Figure 6:
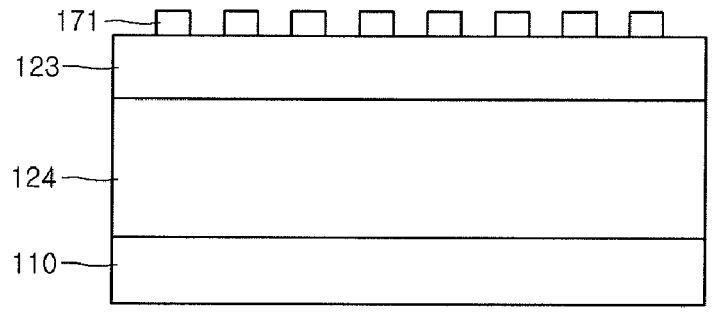
FIGS. 6 to 10 are views explaining a light emitting device according to a second embodiment and a method for manufacturing the same.

Referring to FIG. 6, a non-conductive semiconductor layer 124 is formed on a substrate 110, and a first conductive type semiconductor layer 123 is formed on the non-conductive type semiconductor layer 124. And, mask layers 171 are formed on the first conductive type semiconductor layer 123. The mask layers 171 are selectively formed on the first conductive type semiconductor layer 123 and are disposed to have a first period.

For example, the mask layer 171 may be formed by depositing $SiO_2$ through a plasma-enhanced chemical vapor deposition (PEDVD) and then patterning it, wherein the first period is designed to be $\lambda/n$ to $10\lambda/n$. Herein, n is the refractive index of the first conductive type semiconductor layer 123, and $\lambda$ is the wavelength of light emitted from the active layer 122.

Figure 7:
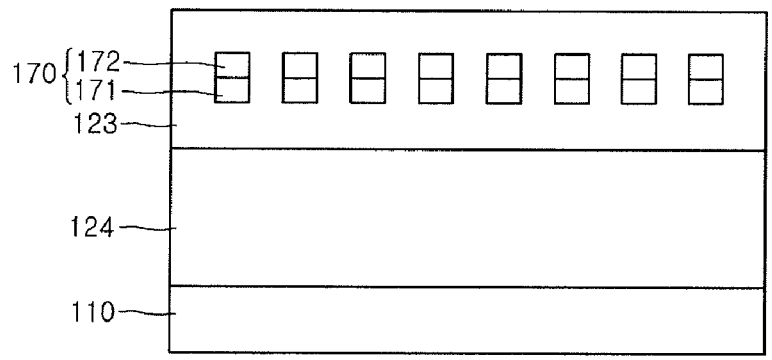

Referring to FIG. 7, the first conductive type semiconductor layer 123 is additionally grown on the first conductive type semiconductor layer 123 on which the mask layers 171 are formed. The first conductive type semiconductor layer 123 does not grow on the mask layers 171 but grows on the first conductive type semiconductor layer 123 on which the mask layers 171 are not formed.

Although the first conductive type semiconductor layer 123 grows in vertical direction and in the horizontal direction, the growth rate in the horizontal direction is smaller than the growth rate in the vertical direction so that the first conductive type semiconductor layer 123 is not formed at positions where the mask layers 171 are positioned and right on the mask layers 171.

Therefore, as shown in FIG. 7, air gaps 172 are formed on the mask layers 171, having the first period, and a first photonic crystal 170 is formed in the first conductive type semiconductor layer 123.

At this time, the first conductive type semiconductor layer 123 on the air gaps 172 has high-quality crystallinity that hardly includes dislocations and thus, the internal quantum efficiency of the light emitting device is increased, making it possible to manufacture high efficiency light emitting device.

Figure 8:
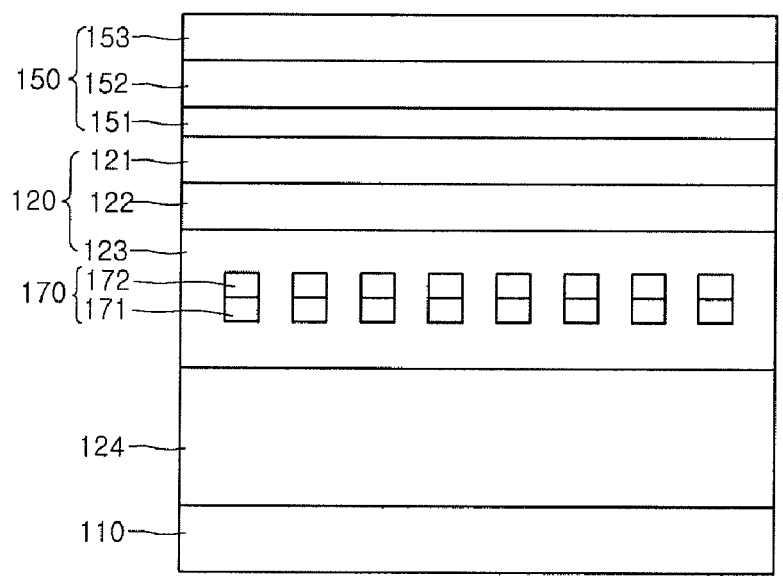

Referring to FIG. 8, a light emitting semiconductor layer 120 is formed by allowing an active layer 122 and a second conductive type layer 121 to grow on the first conductive type semiconductor layer 123.

And, a second electrode layer 150 that includes an ohmic contact layer 151, a reflective layer 152, and a conductive substrate 153 is formed on the light emitting semiconductor layer 120.

Figure 9:
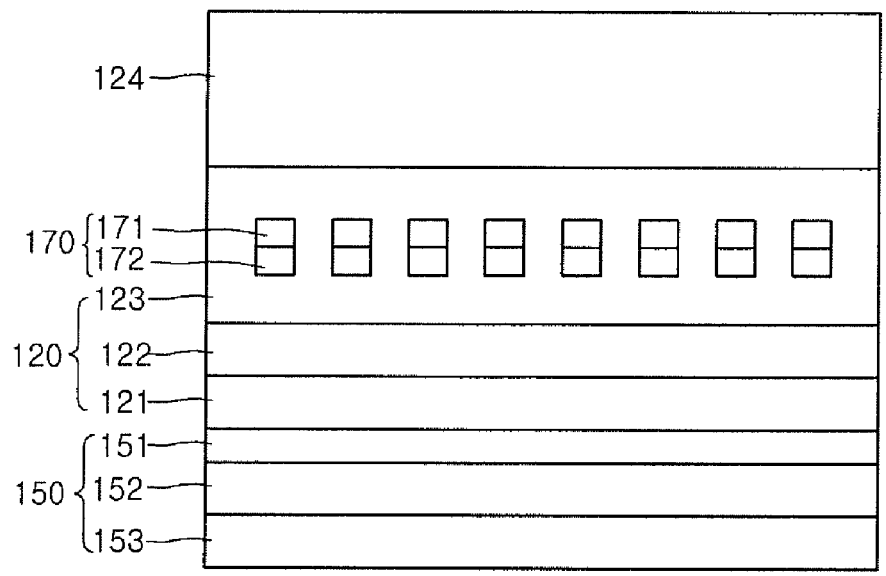

Referring to FIG. 9, the non-conductive semiconductor layer 124 is exposed by removing the substrate 110.

Referring to FIG. 10, the first conductive type semiconductor layer 123 is exposed by selectively removing the non-conductive semiconductor layer 124, and a first electrode layer 160 is formed on the first conductive type semiconductor layer 123.

Therefore, the light emitting device according to the second embodiment can be manufactured.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
    a second electrode layer;
    a light emitting semiconductor layer on the second electrode layer;
    a plurality of first photonic crystals embedded in the light emitting semiconductor layer, each of the plurality of first photonic crystals including an air gap and a solid mask layer directly over the air gap; and
    a first electrode layer on the light emitting semiconductor layer.

2. The light emitting device of claim 1, wherein the first photonic crystal is embedded in an upper surface of the light emitting semiconductor layer.

3. The light emitting device of claim 1, wherein the first photonic crystal is embedded in a central layer of the light emitting semiconductor layer.

4. The light emitting device of claim 1, wherein the light emitting semiconductor layer comprises:
    a second conductive type semiconductor layer on the second electrode layer;
    an active layer on the second conductive type semiconductor layer; and
    a first conductive type semiconductor layer on the active layer,
    wherein the first photonic crystal is embedded in the first conductive type semiconductor layer.

5. The light emitting device according to claim 4,
    wherein a distance between the first photonic crystals is $\lambda/n$ to $10\lambda/n$, and
    wherein n is a refractive index of the first conductive type semiconductor layer, and $\lambda$ is a wavelength of light emitted from the active layer.

6. The light emitting device according to claim 4, wherein an upper surface of the mask layer is in a common horizontal plane as an upper surface of the first conductive type semiconductor layer.

7. The light emitting device according to claim 4, further comprising:
    a non-conductive semiconductor layer formed on the light emitting semiconductor layer.

8. The light emitting device according to claim 7, wherein the mask layer is surrounded by the air gap, the first conductive type semiconductor layer and the non-conductive semiconductor layer.

9. The light emitting device according to claim 7,
    wherein a top portion of the non-conductive semiconductor layer includes periodic structures spaced apart from each other by $\lambda/n$ to $10\lambda/n$, and
    wherein n is a refractive index of the first conductive type semiconductor layer, and $\lambda$ is a wavelength of light emitted from the active layer.

10. The light emitting device according to claim 9, wherein the periodic structures are periodic holes formed in a top surface of the non-conductive semiconductor layer.

11. The light emitting device according to claim 7, wherein the first electrode layer is formed on the light emitting semiconductor layer in between a first subset and a second subset of the non-conductive semiconductor layer 24.

12. The light emitting device according to claim 7, further comprising:
    a second photonic crystal on the non-conductive semiconductor layer.

13. The light emitting device according to claim 12, wherein the second photonic crystal comprises:
    periodic structures spaced apart from each other by $\lambda/n$ to $10\lambda/n$, and
    wherein n is a refractive index of the first conductive type semiconductor layer, and $\lambda$ is a wavelength of light emitted from the active layer.

14. The light emitting device according to claim 13, wherein the periodic structures are periodic holes in a top surface of the non-conductive semiconductor layer.

15. The light emitting device according to claim 7, wherein the non-conductive semiconductor layer is formed of material having an electrical conductivity lower than an electrical conductivity of the first conductive type semiconductor layer and the second conductive type semiconductor layer.

16. The light emitting device according to claim 4, wherein the first photonic crystal has a refractive index lower than a refractive index of the first conductive type semiconductor layer.

17. The light emitting device according to claim 1, wherein the air gap is surrounded by the mask layer and the first conductive type semiconductor layer.

18. The light emitting device according to claim 1, wherein the first electrode layer is formed on the light emitting semiconductor layer in an area between a first subset and a second subset of the first photonic crystal.

19. The light emitting device according to claim 1, wherein the first electrode layer is formed on the light emitting semiconductor layer in an area above the first photonic crystal.

20. The light emitting device according to claim 1, wherein the second electrode layer comprises:
    an ohmic contact layer;
    a reflective layer; and
    a conductive substrate.

* * * * *